(12) United States Patent
Becker et al.

(10) Patent No.: US 9,052,880 B2
(45) Date of Patent: Jun. 9, 2015

(54) MULTI-LEVEL INTERCONNECT APPARATUS

(75) Inventors: Wiren D. Becker, Hyde Park, NY (US); Alan F. Becker, Poughkeepsie, NY (US); William L. Brodsky, Binghamton, NY (US); John G. Torok, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 195 days.

(21) Appl. No.: 13/449,737

(22) Filed: Apr. 18, 2012

(65) Prior Publication Data

US 2013/0279103 A1   Oct. 24, 2013

(51) Int. Cl.
| | |
|---|---|
| *H05K 7/00* | (2006.01) |
| *G06F 1/20* | (2006.01) |
| *G06F 1/16* | (2006.01) |
| *H01L 25/065* | (2006.01) |

(52) U.S. Cl.
CPC .. *G06F 1/20* (2013.01); *G06F 1/16* (2013.01); *H01L 25/0655* (2013.01); *H01L 2924/15192* (2013.01); *H01L 2924/15313* (2013.01)

(58) Field of Classification Search
CPC .................. G06F 1/16; H01L 25/0655; H01L 2924/15192; H01L 2924/15313
USPC .......... 174/260, 255, 250, 534, 548; 361/760, 361/764, 775, 679.4, 803; 257/777, 778, 257/706
See application file for complete search history.

(56) References Cited

U.S. PATENT DOCUMENTS

| | | | |
|---|---|---|---|
| 6,328,484 B1 | 12/2001 | Uebbing | |
| 6,410,983 B1 * | 6/2002 | Moriizumi et al. | 257/723 |
| 6,424,034 B1 * | 7/2002 | Ahn et al. | 257/723 |
| 6,507,115 B1 * | 1/2003 | Hofstee et al. | 257/777 |
| 6,945,712 B1 | 9/2005 | Conn | |
| 6,952,532 B2 | 10/2005 | Dair et al. | |
| 6,969,265 B2 | 11/2005 | van Doorn | |
| 7,099,591 B2 | 8/2006 | Goel | |
| 7,116,912 B2 | 10/2006 | Pang et al. | |
| 7,137,744 B2 | 11/2006 | Wang et al. | |
| 7,181,099 B2 | 2/2007 | Yorks et al. | |
| 7,200,295 B2 | 4/2007 | Rolston et al. | |
| 7,416,353 B2 | 8/2008 | Yoshikawa et al. | |
| 7,470,069 B1 * | 12/2008 | Offrein et al. | 385/88 |
| 7,583,871 B1 | 9/2009 | Bchir et al. | |
| RE41,147 E | 2/2010 | Pang et al. | |
| 7,824,112 B2 | 11/2010 | Epitaux et al. | |
| 7,824,113 B2 | 11/2010 | Wong et al. | |
| 7,880,310 B2 * | 2/2011 | Mathew | 257/777 |
| 7,959,363 B2 | 6/2011 | Scheibenreif et al. | |

(Continued)

*Primary Examiner* — Yuriy Semenenko
(74) *Attorney, Agent, or Firm* — Cantor Colburn LLP; Margaret McNamara

(57) ABSTRACT

A multi-level interconnect apparatus includes a substrate including a substrate body having a first side and a second side opposite the first side, a processing unit disposed on the second side of the substrate body, a first input/output (I/O) unit disposed on the first side of the substrate body and configured to be electrically communicable with the processing unit along a thickness dimension of the substrate body and a second I/O unit disposed on the second side of the substrate body and configured to be electrically communicable with the processing unit along a planar dimension of the substrate body.

23 Claims, 2 Drawing Sheets

(56) References Cited

U.S. PATENT DOCUMENTS

| | | |
|---|---|---|
| 8,047,856 B2 | 11/2011 | McColloch |
| 8,102,663 B2 * | 1/2012 | Cunningham et al. ........ 361/760 |
| 2003/0075355 A1 * | 4/2003 | Anderson et al. ............. 174/254 |
| 2004/0001676 A1 * | 1/2004 | Colgan et al. ................... 385/92 |
| 2005/0135732 A1 * | 6/2005 | Crow et al. ..................... 385/15 |
| 2005/0276547 A1 | 12/2005 | Wang et al. |
| 2006/0036831 A1 * | 2/2006 | Karashima et al. ........... 711/206 |
| 2010/0020505 A1 * | 1/2010 | Brodsky et al. ............... 361/721 |

\* cited by examiner

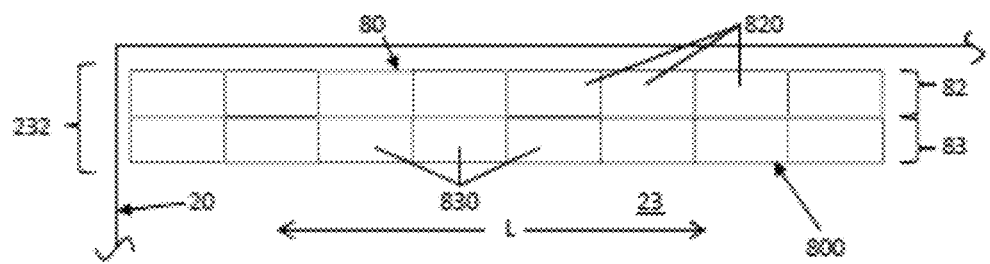
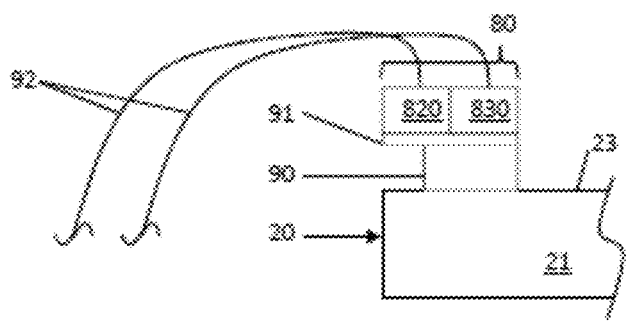

US 9,052,880 B2

MULTI-LEVEL INTERCONNECT APPARATUS

BACKGROUND

Aspects of the present invention relate to a multi-level interconnect apparatus.

Currently, there is an ongoing effort to provide servers and other computing devices that use multi-chip modules (MCM's) with the ability to exhibit improved module performance. Improvements in module performance may be manifested in increased on-module memory, increased and improved communications functions and the presence of faster processor cores with greater capacity. These exemplary module performance improvements generally require increased MCM module circuit densities and this, in turn, requires that internal processing capacities expand along with continual growth in capacities of input/output (I/O) buses (i.e., Gx, SMP, PCIe, Memory, etc. buses).

Bandwidth of a given I/O bus is a product of a width and operating frequency of the I/O bus. As such, two traditional options to meet increased bus requirements have included increased bus frequency or increased bus width (i.e., increased contact count). Increasing the bus frequency to meet growth requirements is limited by several physical design factors, which include line length from driver to receiver and impedance changes through a module substrate, a land grid array (LGA), PCB vias and PCB line traces into a second interface for a receiving device. Meanwhile, the introduction of multiple interconnects and/or interfaces can significantly limit bus frequencies. Also, increasing I/O bus width by adding additional contacts drives contact pitch or spacing, line length, PCB (i.e., mother board) real estate and system packaging trade-offs. Increasing real estate (i.e., total substrate size) to accommodate additional contacts may further limit bus frequencies due to longer line lengths and insignificantly improves bandwidth. By contrast, reducing contact pitch to increase bandwidth increases signal coupling, which drives cross-talk and also limits bus frequencies.

Therefore, MCM assemblies experience a trade-off of increased size and reduced contact pitch to accommodate increased I/O. Both of these directions limit bus frequencies and may actually limit bus bandwidths.

SUMMARY

According to an aspect of the invention, a multi-level interconnect apparatus includes a substrate including a substrate body having a first side and a second side opposite the first side, a processing unit disposed on the second side of the substrate body, a first input/output (I/O) unit disposed on the first side of the substrate body and configured to be electrically communicable with the processing unit along a first dimension and a second I/O unit disposed on the second side of the substrate body and configured to be electrically communicable with the processing unit along a second dimension.

According to another aspect of the invention, a multi-level interconnect apparatus includes a multi-chip module (MCM) substrate including a substrate body having a first side and a second side opposite the first side, a processing unit disposed on the second side of the substrate body, a first input/output (I/O) unit disposed on the first side of the substrate body and configured to be electrically communicable with the processing unit along a first dimension defined through the substrate body and a second I/O unit disposed on the second side of the substrate body and configured to be electrically communicable with the processing unit along a second dimension defined along the second side of the substrate body.

According to yet another aspect of the invention, a multi-level interconnect apparatus includes a multi-chip module (MCM) substrate including a substrate body having a first side and a second side opposite the first side, a processing unit, including a plurality of processors, disposed on a central portion of the second side of the substrate body, a first input/output (I/O) unit disposed on the first side of the substrate body and configured to be electrically communicable with the plurality of processors of the processing unit along a thickness dimension of the substrate body and a second I/O unit disposed on a periphery of the second side of the substrate body and configured to be electrically communicable with the plurality of processors of the processing unit along a planar dimension of the substrate body.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 3 is an expanded top down view of a component of the multi-level interconnect apparatus in accordance with embodiments; and FIG. 4 is an expanded side view of a component of the multi-level interconnect apparatus in accordance with embodiments.

DETAILED DESCRIPTION

In accordance with aspects of the invention and, in order to minimize costs of base level systems, increased bandwidth density of a given multi-chip module (MCM) may be provided by use of input/output (I/O) units that are respectively located on both surfaces of a substrate of the MCM. Such I/O units could include, for example, a land grid array (LGA) on a bottom surface and a second interface on a top surface. Indeed, the top surface interconnect could be of multiple configurations including, but not limited to, a copper (Cu) LGA, a Cu pluggable connector and an optical pluggable interface, etc. The top surface interconnect would provide for ease of field upgrades and repairs.

Figure 1:
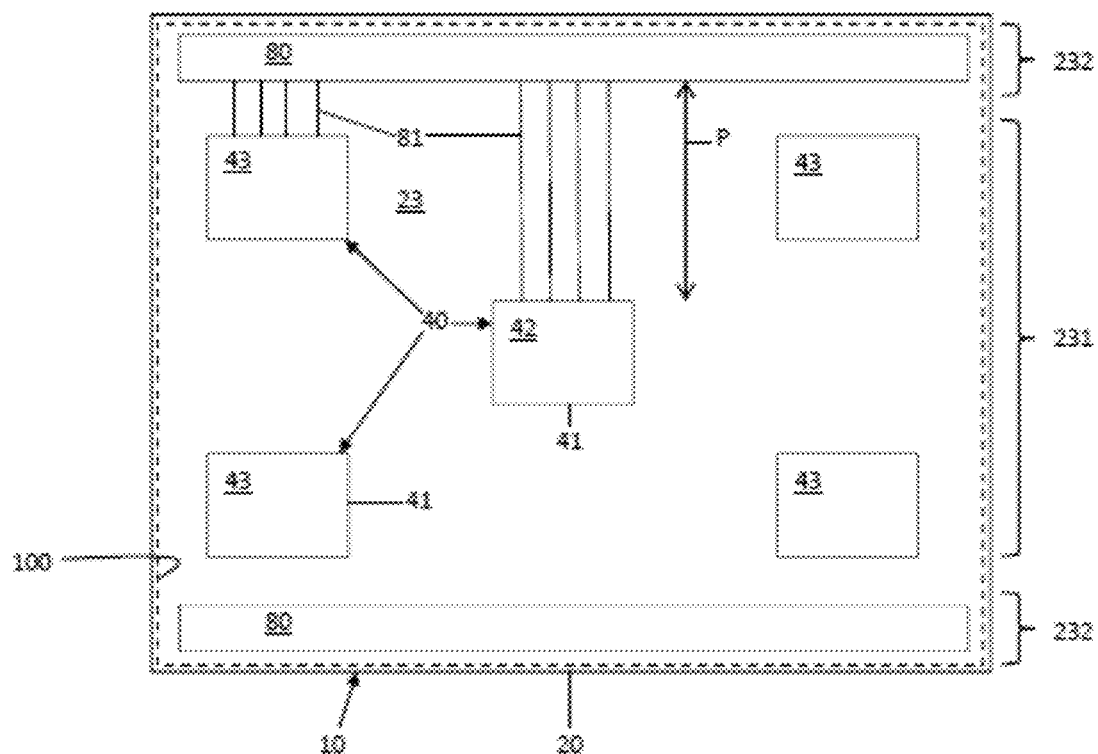
FIG. 1 is a top down view of a multi-level interconnect apparatus.
Figure 2:
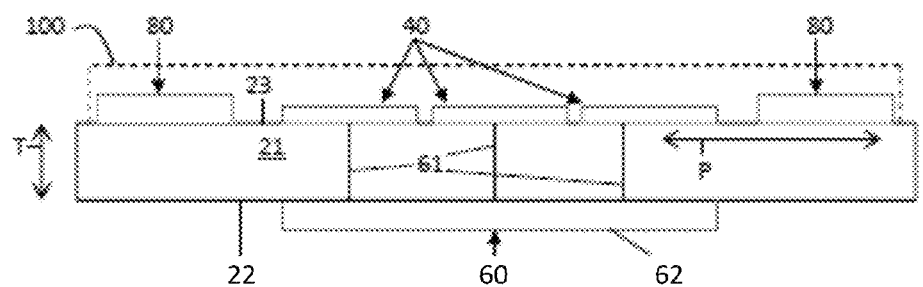
FIG. 2 is a side view of the multi-level interconnect apparatus of FIG. 1.

With reference now to FIGS. 1 and 2, a multi-level interconnect apparatus 10 is provided. The apparatus 10 includes a substrate 20, a processing unit 40, a first I/O unit 60 and a second I/O unit 80. The substrate 20 may be provided as an MCM substrate and may include a substrate body 21 formed of organic or inorganic materials. The substrate body 21 has a first side 22 and a second side 23. The second side 23 is disposed on an opposite side of the substrate body 21 from the first side 22. The processing unit 40 is disposed on the second side 23 of the substrate body 21 and may have various configurations as described below.

A heat sink 100 may be provided in thermal communication with at least the processing unit 40 at or proximate to the second side 23 of the substrate body 21.

The first I/O unit 60 is disposed on the first side 22 of the substrate body 21 and is configured to be electrically communicable with the processing unit 40 via leads 61 disposed to extend substantially along a first (i.e., a thickness) dimension, T, of the substrate body 21. The second I/O unit 80 is disposed on the second side 23 of the substrate body 21 and is configured to be electrically communicable with the processing unit 40 via leads 81 disposed to extend substantially along a second (i.e., a planar) dimension, P, of the second side 23 of the substrate body 21. At least one of the first and second I/O units 60, 80 may include an LGA (i.e., the LGA 62 as shown in FIG. 2).

The first dimension, T, and the second dimension, P, need not be limited to the thickness and planar dimensions, respectively, as described above and below. In general, however, it may be seen that the first dimension, T, and the second dimension, P, should be defined transversely with respect to one another.

The processing unit 40 may include a plurality of processors 41 having at least one single chip (SC) 42 that is surrounded by an array of central processors (CPs) 43. As shown in FIG. 1, the CPs 43 may be disposed proximate to various corners of the at least one single chip 42 or in other similar configurations. In any case, it is to be understood that the plurality of processors 41 can be arranged and configured in various manners. In general, it may be seen that the processing unit 40 will be disposed within a central portion 231 of the second side 23 of the substrate body 21 and that the second I/O unit 80 will be disposed within a periphery 232 of the second side 23 of the substrate body 21.

The second I/O unit 80 may be provided in various configurations with multiple mechanical and/or structural features. For example, the second I/O unit 80 may include a module with a top surface metallurgy (TSM) pluggable connector for a copper cable interface, for an optic module subassembly or for an optic module subassembly including an optical cable pigtail. As further examples, the second I/O unit 80 may include a module with a TSM pluggable connector for active cable assembly where a transmission/receiving device is attached to the cable, a module with a TSM pluggable connector for optic module assembly where multiple transmission/receiving assemblies are interconnected simultaneously or for a module with a TSM pluggable connector for active optic assembly including mechanical retention of the optic assembly. Each of these examples may be provided alone or in combination with others listed herein or otherwise known in the art.

With reference to FIG. 3 and, in accordance with embodiments, it may be seen that the second I/O unit 80 may be disposed within the periphery 232 of the second side 23 of the substrate 20 such that the second I/O unit 80 extends in a lateral planar direction along a length, L, of the substrate 20. As shown in FIG. 3, the second I/O unit 80 may include an optical module 800 with a lateral array 82 of optical transmission elements 820 and a lateral array 83 of optical receiving elements 830. Each individual optical transmission element 820 and each individual optical receiving element 830 may be operably coupled to the processing unit 40 along any one or more of the leads 81.

With reference to FIG. 4 and, in accordance with further embodiments, the second I/O unit 80 may be connected to the substrate 20 via a plug 90 including a secondary laminate/substrate 91. In this case, the secondary laminate/substrate 91 is structurally interposed between the second I/O unit 80 (or, more particularly, the optical transmission elements 820 and the optical receiving elements 830) and the plug 90. As shown in FIG. 4, exemplary optical wiring 92 can extend away from the optical transmission elements 820 and the optical receiving elements 830 in any one or more of various directions.

As illustrated in FIG. 1, the second I/O unit 80 may be provided as a plurality of second I/O units 80. In such cases, each individual second I/O unit 80 may be configured substantially similarly or with a unique configuration, unique mechanical features and/or unique structural features.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A multi-level interconnect apparatus, comprising:
   a substrate including a substrate body having a first side and a second side opposite the first side;
   a processing unit disposed on and in direct contact with the second side of the substrate body;
   a first input/output (I/O) unit disposed on and in direct contact with the first side of the substrate body and configured to be electrically communicable with the processing unit via leads disposed to extend along a first dimension; and
   a second I/O unit disposed on and in direct contact with the second side of the substrate body and configured to be electrically communicable with the processing unit via leads disposed to extend along a second dimension.

2. The multi-level interconnect apparatus according to claim 1, wherein the first and second dimensions are defined transversely with respect to one another.

3. The multi-level interconnect apparatus according to claim 1, wherein the first dimension is a thickness dimension of the substrate and the second dimension is a planar dimension of the substrate.

4. The multi-level interconnect apparatus according to claim 1, further comprising a heat sink disposed in thermal communication with the processing unit.

5. The multi-level interconnect apparatus according to claim 1, wherein the substrate comprises an organic substrate.

6. The multi-level interconnect apparatus according to claim 1, wherein the substrate comprises a multi-chip module (MCM).

7. The multi-level interconnect apparatus according to claim 1, wherein the processing unit comprises a plurality of processors.

8. The multi-level interconnect apparatus according to claim 7, wherein the plurality of processors comprises at least one single chip (SC) surrounded by an array of central processors (CPs) disposed in corners of a central portion of the second side with the second I/O unit disposed in a periphery of the second side.

9. The multi-level interconnect apparatus according to claim 1, wherein the first I/O unit comprises a land grid array (LGA).

10. The multi-level interconnect apparatus according to claim 9, wherein the second I/O unit comprises an optical module connected to the substrate via a plug including a secondary substrate structurally interposed between the second I/O unit and the plug.

11. A multi-level interconnect apparatus, comprising:
a multi-chip module (MCM) substrate including a substrate body having a first side and a second side opposite the first side;
a processing unit disposed on and in direct contact with the second side of the substrate body;
a first input/output (I/O) unit disposed on and in direct contact with the first side of the substrate body and configured to be electrically communicable with the processing unit via leads disposed to extend along a thickness dimension defined through the substrate body; and
a second I/O unit disposed on and in direct contact with the second side of the substrate body and configured to be electrically communicable with the processing unit via leads disposed to extend along a planar dimension defined along the second side of the substrate body.

12. The multi-level interconnect apparatus according to claim 11, wherein the thickness and planar dimensions are defined perpendicularly with respect to one another.

13. The multi-level interconnect apparatus according to claim 11, further comprising a heat sink disposed in thermal communication with the processing unit.

14. The multi-level interconnect apparatus according to claim 11, wherein the substrate comprises an organic substrate.

15. The multi-level interconnect apparatus according to claim 11, wherein the processing unit comprises a plurality of processors.

16. The multi-level interconnect apparatus according to claim 15, wherein the plurality of processors comprises at least one single chip (SC) surrounded by an array of central processors (CPs) respectively disposed in corresponding corners of a central portion of the second side with the second I/O unit disposed as a plurality of second I/O units in a periphery of the second side on opposite sides of the central portion.

17. The multi-level interconnect apparatus according to claim 11, wherein the first I/O unit comprises a land grid array (LGA).

18. The multi-level interconnect apparatus according to claim 17, wherein the second I/O unit comprises an optical module connected to the substrate via a plug including a secondary substrate structurally interposed between the second I/O unit and the plug.

19. The multi-level interconnect apparatus according to claim 17, further comprising a heat sink disposed in thermal communication with the processing unit.

20. The multi-level interconnect apparatus according to claim 17, wherein the substrate comprises an organic substrate.

21. The multi-level interconnect apparatus according to claim 17, wherein the first I/O unit comprises a land grid array (LGA) and the second I/O unit comprises an optical module.

22. The multi-level interconnect apparatus according to claim 21, wherein the optical module comprises
a lateral array of optical transmission elements, each optical transmission element being coupled to the processing unit via any one or more of the leads disposed to extend along the planar dimension of the substrate body; and
a lateral array of optical receiving elements, each optical receiving element being coupled to the processing unit via any one or more of the leads disposed to extend along the planar dimension of the substrate body.

23. A multi-level interconnect apparatus, comprising:
a multi-chip module (MCM) substrate including a substrate body having a first side and a second side opposite the first side;
a processing unit, including a plurality of processors, disposed on and in direct contact with a central portion of the second side of the substrate body with a single chip surrounded by an array of central processors;
a first input/output (I/O) unit disposed on and in direct contact with the first side of the substrate body and configured to be electrically communicable with the plurality of processors of the processing unit via leads disposed to extend along a thickness dimension of the substrate body; and
a second I/O unit disposed on and in direct contact with a periphery of the second side of the substrate body and configured to be electrically communicable with the plurality of processors of the processing unit via leads disposed to entirely extend along a planar dimension of the substrate body.

* * * * *

UNITED STATES PATENT AND TRADEMARK OFFICE
CERTIFICATE OF CORRECTION

| | | |
|---|---|---|
| PATENT NO. | : 9,052,880 B2 | Page 1 of 1 |
| APPLICATION NO. | : 13/449737 | |
| DATED | : June 9, 2015 | |
| INVENTOR(S) | : Wiren D. Becker et al. | |

It is certified that error appears in the above-identified patent and that said Letters Patent is hereby corrected as shown below:

Title Page, Item (75) Inventors, 2nd inventor "Alan F. Becker", should read "Alan F. Benner".

Signed and Sealed this
Twelfth Day of April, 2016

Michelle K. Lee
*Director of the United States Patent and Trademark Office*